United States Patent
Chakravarthi et al.

(10) Patent No.: US 7,553,717 B2
(45) Date of Patent: Jun. 30, 2009

(54) RECESS ETCH FOR EPITAXIAL SIGE

(75) Inventors: Srinivasan Chakravarthi, Murphy, TX (US); Periannan Chidambaram, Richardson, TX (US); Johan Weijtmans, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 207 days.

(21) Appl. No.: 11/747,708

(22) Filed: May 11, 2007

(65) Prior Publication Data
US 2008/0277699 A1 Nov. 13, 2008

(51) Int. Cl.
*H01L 21/336* (2006.01)
*H01L 21/8234* (2006.01)

(52) U.S. Cl. .............. 438/197; 438/225; 438/259; 438/270; 257/E21.429; 257/E21.553

(58) Field of Classification Search .......... 438/197, 438/225, 245, 44, 270, 424, 259; 257/E29.345, 257/E21.429, E21.553
See application file for complete search history.

(56) References Cited

U.S. PATENT DOCUMENTS

| | | | | |
|---|---|---|---|---|
| 5,559,053 A | * | 9/1996 | Choquette et al. ........... | 438/41 |
| 5,858,857 A | * | 1/1999 | Ho .............................. | 438/424 |
| 6,165,870 A | * | 12/2000 | Shim et al. .................. | 438/424 |
| 6,562,696 B1 | * | 5/2003 | Hsu et al. .................... | 438/424 |
| 2003/0098479 A1 | * | 5/2003 | Murthy et al. ............... | 257/288 |
| 2004/0092114 A1 | * | 5/2004 | Lee ............................ | 438/690 |
| 2004/0262683 A1 | * | 12/2004 | Bohr et al. ................... | 257/338 |
| 2005/0118793 A1 | * | 6/2005 | Snyder et al. ............... | 438/581 |
| 2005/0148147 A1 | * | 7/2005 | Keating et al. .............. | 438/299 |
| 2006/0088968 A1 | * | 4/2006 | Shin et al. ................... | 438/299 |
| 2006/0115949 A1 | * | 6/2006 | Zhang et al. ................ | 438/300 |
| 2006/0240630 A1 | * | 10/2006 | Bauer et al. ................. | 438/301 |
| 2007/0023847 A1 | * | 2/2007 | Rhee et al. .................. | 257/408 |
| 2007/0072353 A1 | * | 3/2007 | Wu et al. ..................... | 438/197 |
| 2007/0105331 A1 | * | 5/2007 | Murthy et al. ............... | 438/341 |
| 2007/0249168 A1 | * | 10/2007 | Rotondaro et al. .......... | 438/700 |
| 2008/0242032 A1 | * | 10/2008 | Chakravarthi et al. ....... | 438/285 |

* cited by examiner

*Primary Examiner*—Thanh V Pham
*Assistant Examiner*—Duy T Nguyen
(74) *Attorney, Agent, or Firm*—Rose Alyssa Keagy; Wade J. Brady, III; Frederick J. Telecky, Jr.

(57) ABSTRACT

A PMOS transistor and a method for fabricating a PMOS transistor. The method may include providing a semiconductor wafer having a PMOS transistor gate stack, source/drain extension regions, and active regions. The method may also include forming epi sidewalls, performing a ex-situ recess etch, and performing an in-situ recess etch. The ex-situ recess etch and the in-situ recess etch form recessed active regions. The PMOS transistor is formed by a method using ex-situ and in-situ etch and has epitaxial SiGe regions with a greatest width at the surface of the semiconductor wafer.

11 Claims, 8 Drawing Sheets

RECESS ETCH FOR EPITAXIAL SIGE

BACKGROUND OF THE INVENTION

This invention relates to the recess etch for epitaxial SiGe in PMOS transistors.

DETAILED DESCRIPTION OF THE INVENTION

Figure 1:
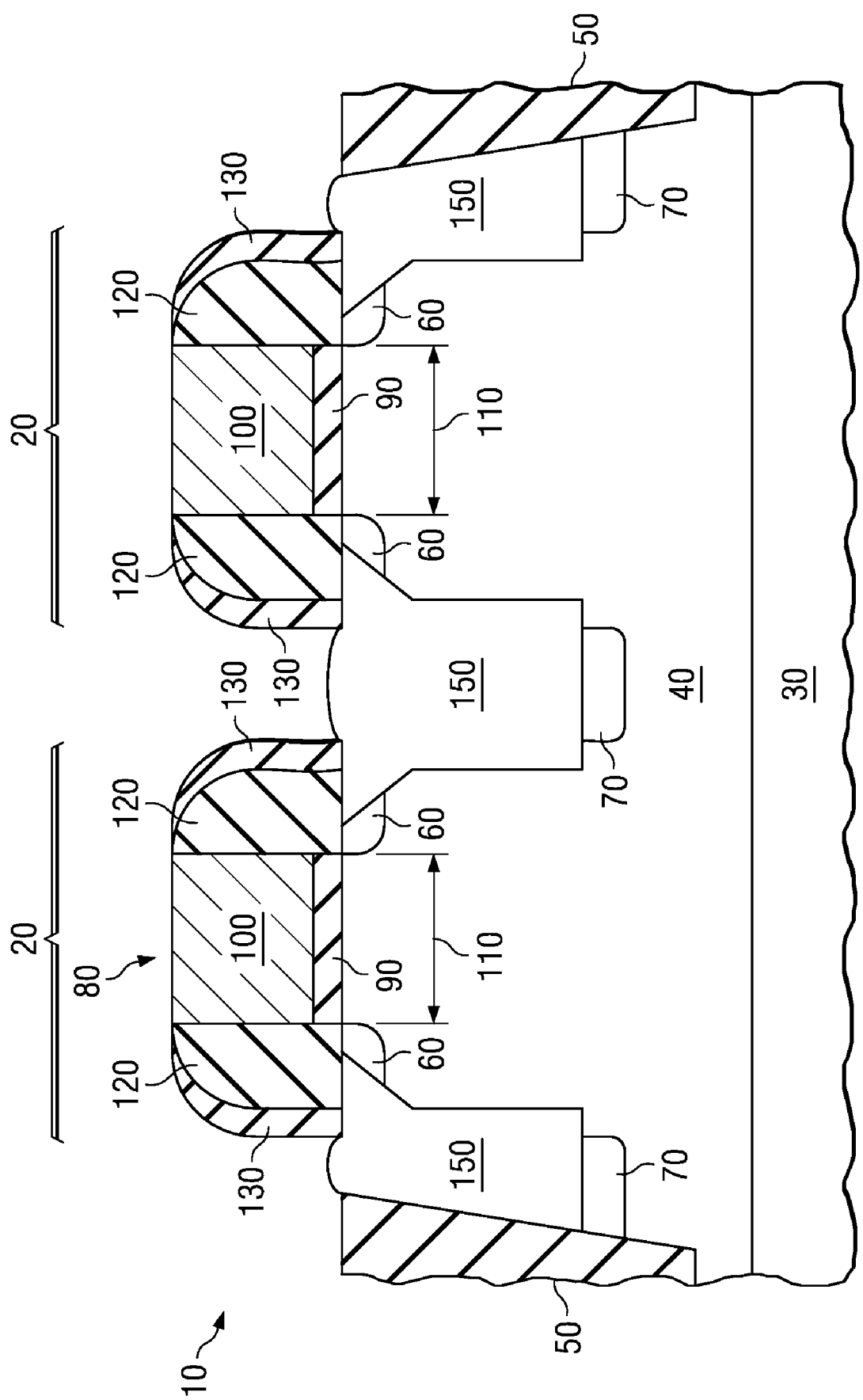
FIG. 1 is a cross-sectional view of a partially fabricated semiconductor wafer.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a partially fabricated semiconductor wafer 10. In the example application, PMOS transistors 20 are epitaxial SiGe transistors that are formed within a semiconductor substrate 30 having an n-well region 40. SiGe transistors contain epitaxial SiGe regions 150 that may improve transistor performance by increasing the mobility of the carriers in the channel 110 of the PMOS transistors 20 (facilitated by the intentionally created lattice mismatch that induces mechanical stress across the channel region 110). Specifically, the compressively-stressed channel typically provides an improved hole mobility that improves the performance of PMOS transistors 20 by increasing the PMOS drive current.

The PMOS transistors 20 are electrically insulated from other active devices (not shown) by shallow trench isolation structures 50 formed within the semiconductor wafer 10; however, any conventional isolation structure may be used, such as field oxide regions (also known as "LOCOS" regions) or implanted isolation regions. The semiconductor substrate 30 is a doped single-crystalline substrate; however, it may be comprised of a different material such as GaAs or InP, and it may have additional layers.

The active portions of the PMOS transistors 20 are the p-type doped source/drain extension regions 60, the p-type doped source/drain regions 70, p-type doped epitaxial SiGe regions 150, and a PMOS transistor gate stack 80 that is comprised of a gate oxide 90 and a p-type doped polysilicon electrode 100. However, it is within the scope of the invention for the PMOS transistor to have a metal gate electrode 100 instead of a polysilicon gate electrode 100. The channel region 110 of the PMOS transistors 20 is located directly below the gate oxide 90 within the n-well 40.

Figure 2:
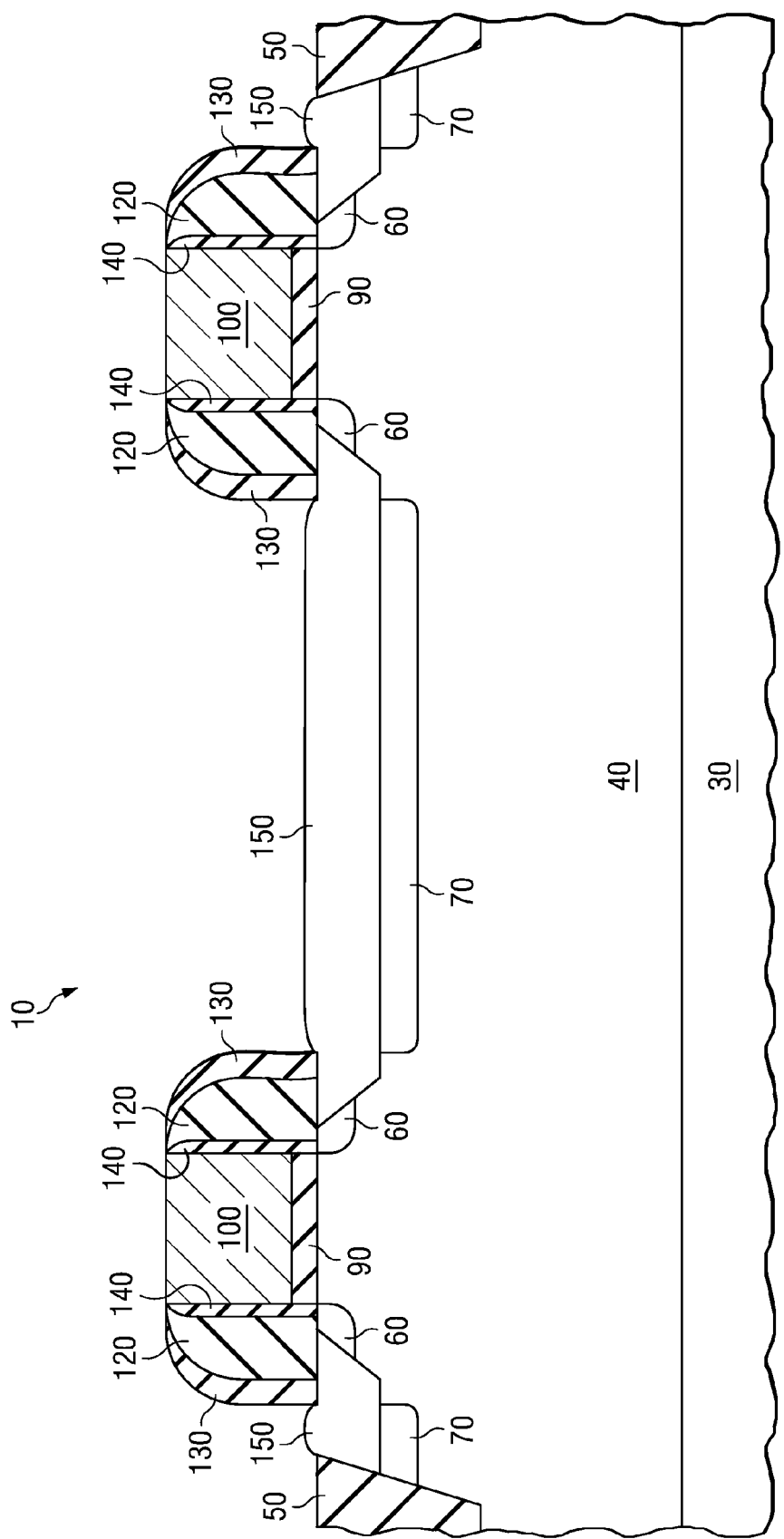
FIG. 2 is a cross-sectional view of an alternative partially fabricated semiconductor wafer.

The PMOS transistors 20 also have offset layers 120, 130 that are used during semiconductor fabrication to enable the proper placement of the source/drain regions 70 and the epitaxial SiGe regions 150. In the example application shown in FIG. 1, the source/drain extension regions 60 are formed using the gate stack 90, 100 as a mask. However, in an alternative application, extension sidewalls 140 may be formed proximate to the gate stack 80 (as shown in FIG. 2) and then used with the gate stack to act as a mask when implanting the dopants for the source/drain extension regions 60.

The gate stack 80 and the epi sidewalls 120 of the PMOS transistors 20 are used as a mask to form the epitaxial SiGe regions 150. In the example application, an ex-situ recess etch plus an in-situ recess etch are used to form the recessed active regions before the formation of the epitaxial SiGe regions 150. This etch combination (described infra) will create epitaxial SiGe regions 150 that are generally funnel shaped for adjoining PMOS transistors 20 having a shared source region 70 for one example application shown in FIG. 1. Alternatively, the cross-section of the epitaxial SiGe regions 150 are generally isosceles trapezoid shaped if the PMOS transistors are formed further apart within the semiconductor wafer 10, as shown in FIG. 2.

The source/drain regions 70 are formed using the gate stack 80, the epi sidewalls 120, and the source/drain sidewalls 130 as a mask. It is to be noted that the source/drain extension anneal and the source/drain anneal will likely cause a lateral migration of the source/drain extension regions 60, the epitaxial SiGe regions 150, and the source/drain regions 70 toward the channel region 110 of the transistor. Therefore, the borders of the source/drain extension regions 60, the epitaxial SiGe regions 150, and the source/drain regions 70 will be softer than what is illustrated in FIGS. 1-2 when looking at a cross-section of a completed integrated through a transmission electron microscope ("TEM").

In subsequent fabrication steps (not shown), a silicide layer may be formed overlying the polysilicon gate electrode 100 and the epitaxial SiGe regions 150. The optional silicide layer facilitates an improved electrical connection between the epitaxial SiGe regions 150 and the transistor's metal contacts (not shown). Preferably, the silicide layer contains Ni or a combination of Ni and Pt. However, it is within the scope of the invention to use any suitable material—or combination of materials—within the silicide layer, such as Co, Ti, Pd, or Ir.

The remaining "front-end" portion of a completed integrated circuit generally contains metal contacts that electrically connect the PMOS transistors 20 of FIGS. 1-2 to other active or passive devices that are located throughout the semiconductor wafer 10. The front-end also generally contains an insulative dielectric layer that electrically insulates the transistor's metal contacts. The back-end of a completed integrated circuit generally contains one or more interconnect layers (and possibly one or more via layers) that properly route electrical signals and power between the PMOS transistors 20 and the other electrical components of the completed integrated circuit.

Referring again to the drawings, FIGS. 3A-3E are cross-sectional views of a partially fabricated semiconductor wafer that illustrate an example process for forming the PMOS transistors 20 of FIGS. 1-2. It is within the scope of the invention to use this process to form other transistor devices that vary in some manner from the example PMOS transistor 30. For instance, the described method may be used to fabricate PMOS transistors on alternative substrates such as silicon-on-insulator ("SOI") or Ge on SOI.

Figure 3A:
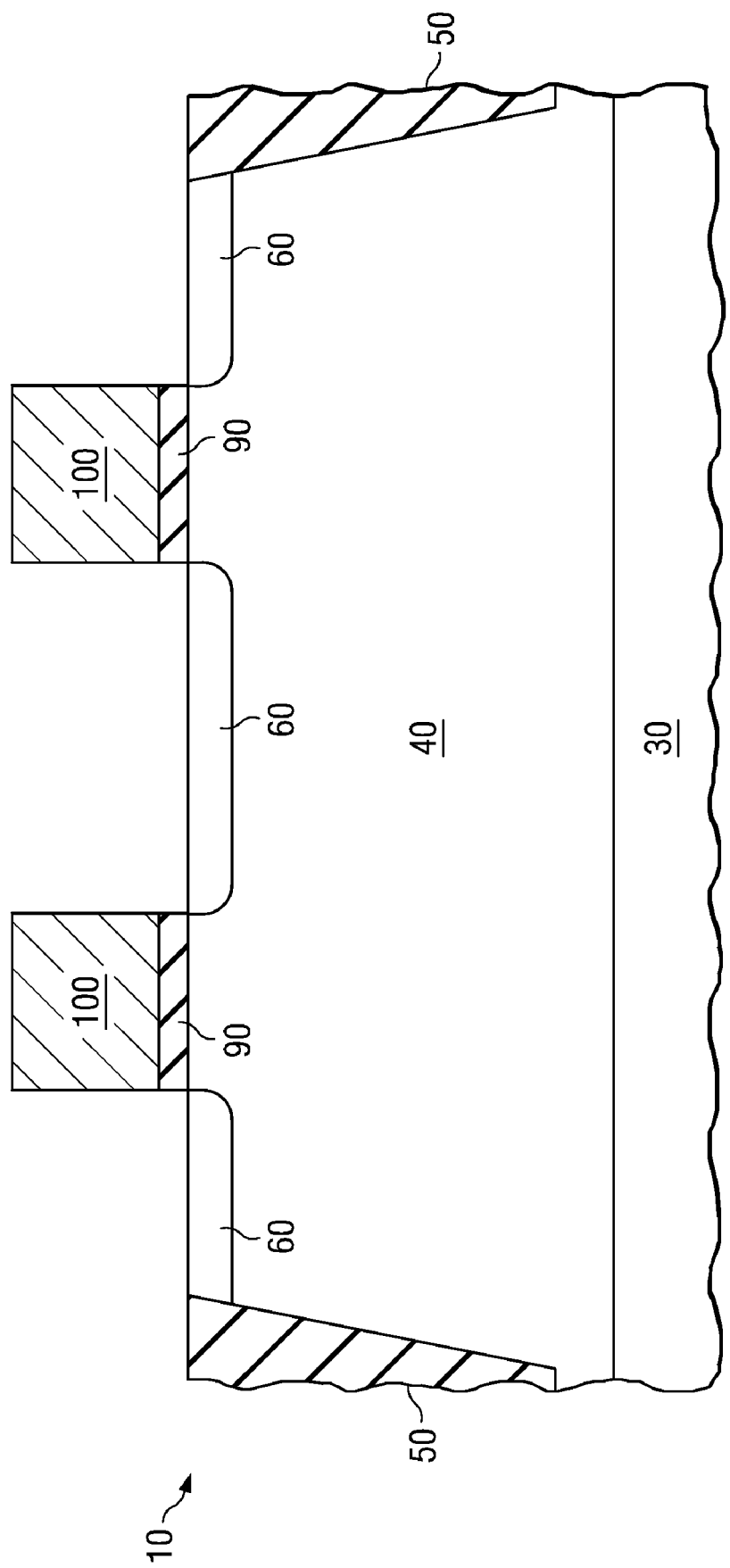
FIGS. 3A-3F are cross-sectional diagrams of a process for forming a semiconductor wafer.

FIG. 3A is a cross-sectional view of the semiconductor wafer 10 after the formation of a portion of the PMOS transistors. Specifically, the semiconductor wafer 10 contains the shallow trench isolation structures 50, the n-well 40 within the substrate 30, the gate stacks 80 comprising the gate oxide 90 and the gate electrode 100, and the source/drain extension regions 60. In the example application, the PMOS transistor gate stacks 80 were used as the mask to form the source/drain extension regions 60; however, if the optional extension sidewalls 140 (discussed supra and shown in FIG. 2) were used, then the semiconductor wafer 10 will also contain the optional extension sidewalls 140. The fabrication processes used to form the semiconductor wafer 10 shown in FIG. 3A are those that are standard in the industry, such as the fabrication process described in the commonly assigned U.S. Pat. No. _____ (Ser. No. 11/677,496, filed Feb. 21, 2007), incorporated herein by reference and not admitted to be prior art with respect to the present invention by its mention in this section.

It is within the scope of the invention for all of the gate electrodes have an optional gate hardmask comprised of $SiO_2$, SiN, SiON, or a combination thereof (as described in the incorporated reference). If used, the gate hardmask may protect the gate electrodes 100 from undesired etching and epitaxial formation during the processes shown in FIGS. 3C-3E and described infra.

It is also within the scope of the embodiment to form halo implant regions within the n-well 40 (not shown). The optional halo implants (sometimes called "pocket implants" or "punch through stoppers" because of their ability to stop punch through current) may be formed with any standard implant or diffusion process within—or proximate to—the channel, the extension regions, or the source/drain regions.

Figure 3B:
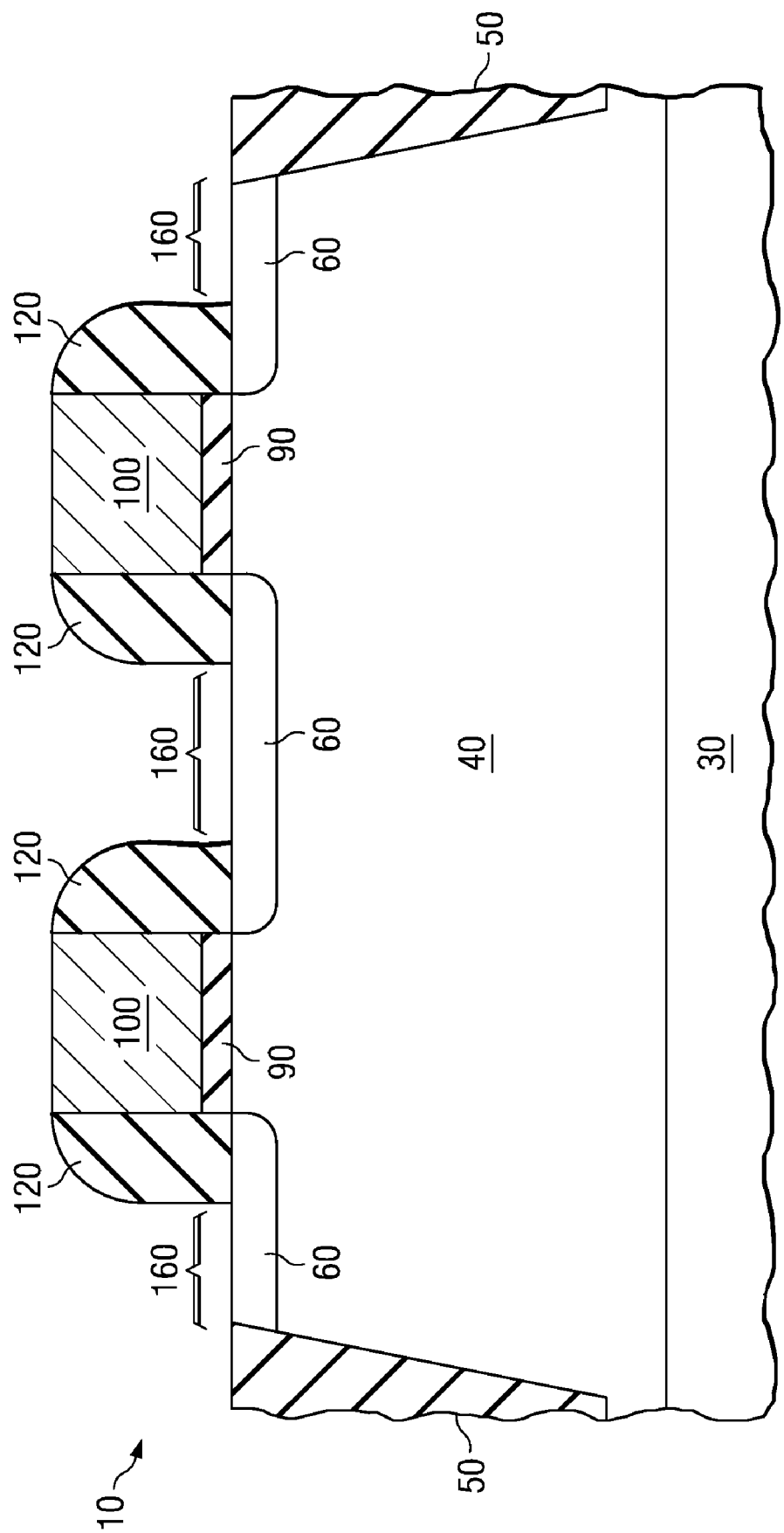

As shown in FIG. 3B, the epi sidewalls 120 are now formed proximate to the gate stack 80 in preparation for the recess etch steps (170, 190). The epi sidewalls 120 are fabricated using any standard process. For example, one or more layers of insulating materials, such as oxide or nitride based materials, are first applied conformally over the semiconductor wafer 10. Then an anisotropic etch is used to remove the insulating material over the gate electrode 100 and the surface of most of the n-well 40, while leaving insulating material 120 on the sidewalls of the gate stack 80. It is to be noted that the thickness of the epi sidewalls 120 may be adjusted to change the location of the subsequently formed epitaxial SiGe regions 150 in order to obtain a targeted transistor performance (that is determined by the amount of source/drain extension regions 70 that is etched during the recess etch process and therefore the amount remaining in the final PMOS structure). The exposed surfaces of the n-well 40 after the formation of the epi sidewalls 120 (i.e. the exposed surfaces of the source/drain extension regions 60) are now the active regions 160 of the PMOS transistors 20.

Figure 3C:
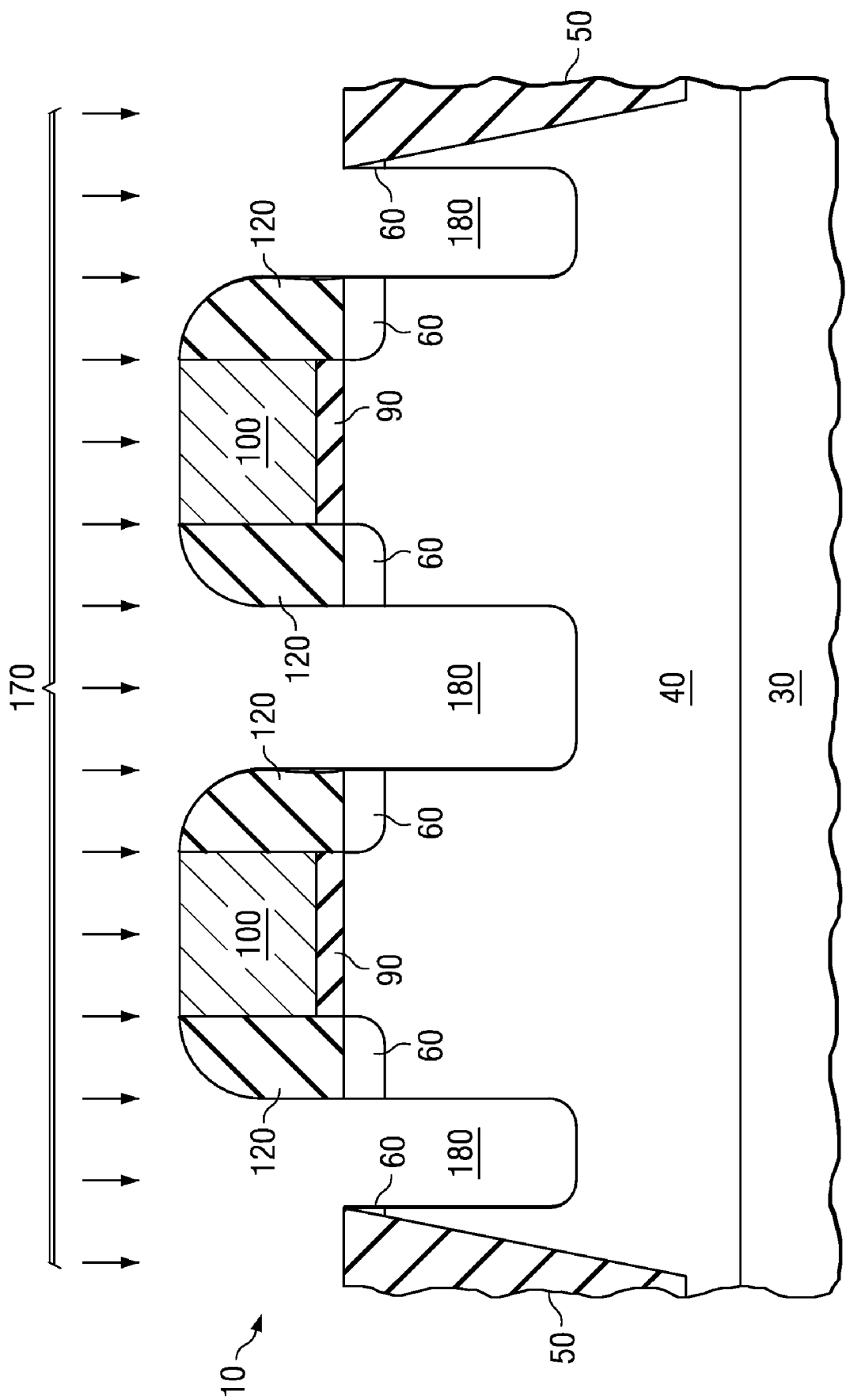

The next step in the example application is an ex-situ recess etch 170 of the active regions 160 of the PMOS transistor 30, as shown in FIG. 3C. Preferably, the ex-situ recess etch 170 is a standard anisotropic etch of the active regions 160 (i.e. a "box etch); therefore, the sides of the ex-situ recesses 180 are generally perpendicular to the surface of the n-well region 40. An anisotropic ex-situ recess etch 170 will also ensure that a maximum amount of previously formed doped extension regions 60 remains after the formation of the ex-situ recesses 180. However, it is within the scope of the example embodiment to perform an ex-situ recess etch 170 using a combination of an anisotropic etch with a minimal isotropic etch. An isotropic etch will generally be balloon-shaped and undercut the extension sidewalls 60, thereby creating ex-situ recesses 180 that encroach closer to the channel region 110 and removes more material in the source/drain extension regions 60 (resulting in a corresponding change in the dosing level of those source/drain extension regions 60). Therefore, a combination of an anisotropic etch with a minimal isotropic etch may result in a recess etch having a small taper (i.e. a minimal recess shape tunneling).

The ex-situ recess etch 170 of the example application may be any suitable etch process. For instance, a standard plasma etch machine (such as the Kiyo by LAM) may be used at a temperature of 40-100° C., a pressure of 1-10 torr, and with HBr, $CF_4$, and $O_2$ precursor gases. It is to be noted that the etch 170 is considered to be "ex-situ" because it is performed in a different machine than the SiGe epitaxial deposition step (210).

It is within the scope of the invention to form the ex-situ recesses 180 to any suitable depth (i.e. from a depth that is shallower than the extension regions 60 to a depth that is greater than the source/drain regions 70). In the example application, the ex-situ recesses 180 are etched to a depth between 100-1200 Å, which is greater than the depth of the source/drain extension regions 60 and approximately the same depth as the subsequently formed source and drain regions 70 (see FIG. 1).

Figure 3D:
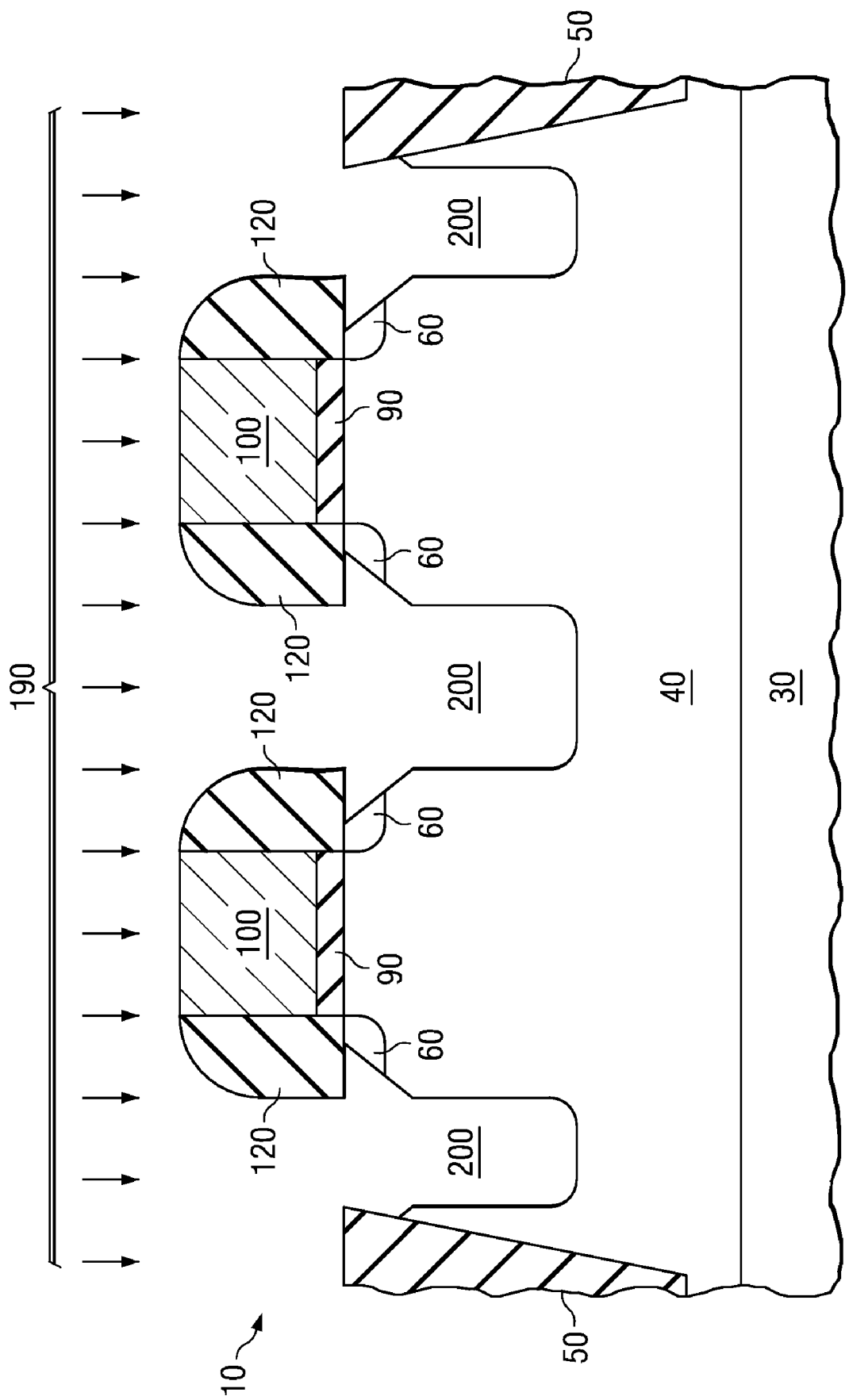

The next step in the example application is an in-situ recess etch 190 of the exposed n-well 40, as shown in FIG. 3D. (It is to be noted that the exposed n-well or active regions 160 of the NMOS transistors are protected by a patterned photoresist during the recess etch steps 170, 190 of the example application.) In the example application, the in-situ recess etch 190 is an HF epi etch of the exposed n-well 40; therefore, the in-situ etch will undercut the epi sidewalls 120 (along the surface of the n-well 40 in accordance with the Si crystal plane) and also etch the exposed n-well 40. The in-situ recess etch 190 may be any suitable epi etch process, such as reduced-temperature chemical vapor deposition ("RTCVD"), ultra-high vacuum chemical vapor deposition ("UHCVD"), molecular beam epitaxy ("MBE"), or a small or large batch furnace-based process. In the example application, a standard RTCVD machine (such as the Epsilon by ASM or the Centura by AMAT) is used at a temperature range of 450-1000° C. and a pressure between 1-300 torr for a period of 30 seconds to 5 minutes with HCl and $H_2$ gas. (Process selectivity is achieved by including the HCl (hydrochloric acid) and the carrier gas $H_2$ (hydrogen).) It is to be noted that the time period for the epi etch 190 is generally determined by the amount of undercut desired. For example, the performance of the PMOS transistor 20 may be improved by undercutting the epi sidewalls 120 to facilitate the placement of the epitaxial SiGe regions 150 close to the channel region 110 at the surface of n-well 40 (increasing channel stress and thereby also increasing device speed). However, it may be undesirable to continue the in-situ recess etch process until it undercuts into the channel region 110 because the performance of the PMOS transistors may be compromised by a reduced channel region 110. It is also to be noted that the etch 190 is considered to be "in-situ" because it is performed in the same deposition machine that will be used for the subsequent SiGe epitaxial deposition step (210).

The combination of the ex-situ recess etch 170 and the in-situ recess etch 190 creates recess active regions 200 that are shaped differently than recesses formed by the ex-situ recess etch 170 or the in-situ recess etch 190 alone. Moreover, the depth of recessed active regions 200 is generally controlled by the ex-situ etch 170 while the width of the recessed active regions is generally controlled by the in-situ etch 190. In the example application shown in FIG. 3D, the recessed active regions have a funnel shaped cross-section (created by the angled epi-etch at the top portion of the deep box etch). In an alternative application (shown in FIG. 2), the recessed active regions may have an isosceles trapezoid shaped cross-section that is created by an (in-situ) angled epi-etch at approximately the same depth as the (ex-situ) box etch.

Figure 3E:
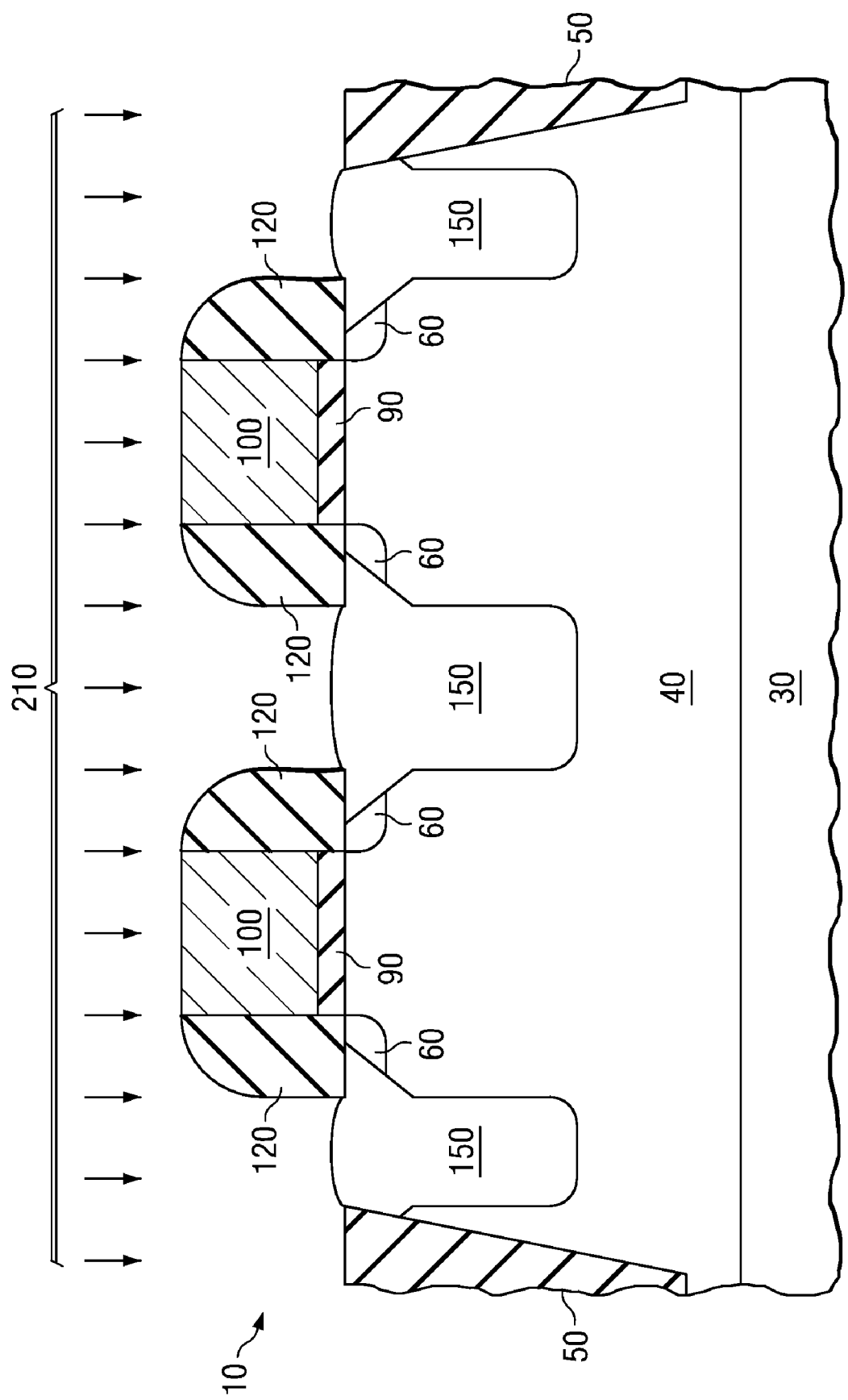

The epitaxial SiGe regions 150 are now formed over the recessed active regions 200 of the PMOS transistors 20, as shown in FIG. 3E. The epitaxial SiGe regions 150 are considered 'selective' because the epitaxial layer is comprised of SiGe that is selectively deposited on the exposed active silicon substrate 30,40 within the recessed active regions 200; however, it is not deposited on any dielectric regions, such as the regions containing $SiO_2$ or $Si_3N_4$. Moreover, the epitaxial SiGe regions 150 may be doped or undoped. For instance, in the example application the epitaxial SiGe regions 150 are doped p-type with B.

The epitaxial SiGe regions 150 may be formed by any suitable standard process. In the example application, the epi deposition process 210 is performed in the same machine (without breaking vacuum) as the previous in-situ recess etch process 190. More specifically, the in-situ recess etch 190 transitions smoothly into the epi deposition process 210 by reducing the flow of the HCl gas and simultaneously introducing a silicon-bearing precursor DCS (dichlorosilane), a germanium-bearing precursor $GeH_4$ (germane), and a p-doping precursor $B_2H_6$ (diborane) into the deposition chamber. Alternatively, the epitaxial deposition process 210 may also include a carbon-bearing precursor $SiH_3CH_3$ (mono-methylsilane). The example RTCVD process uses a temperature range of 450-800° C. and a pressure between 1-100 torr.

As shown in FIG. 3E, the RTCVD process 210 creates a slight rise in the top surface of the epitaxial SiGe regions 150 above the top surface of the recessed active regions 200. Therefore, the RTCVD process 210 not only back-fills the recessed active regions 200, it also continues to grow the epitaxial SiGe regions 150 to a height somewhere above the surface of the n-well 40. Growing the epitaxial SiGe regions 150 thicker than the depth of the recessed active regions 200 can mitigate the impact of the loss of epitaxial SiGe during the subsequent silicidation processes.

Figure 3F:
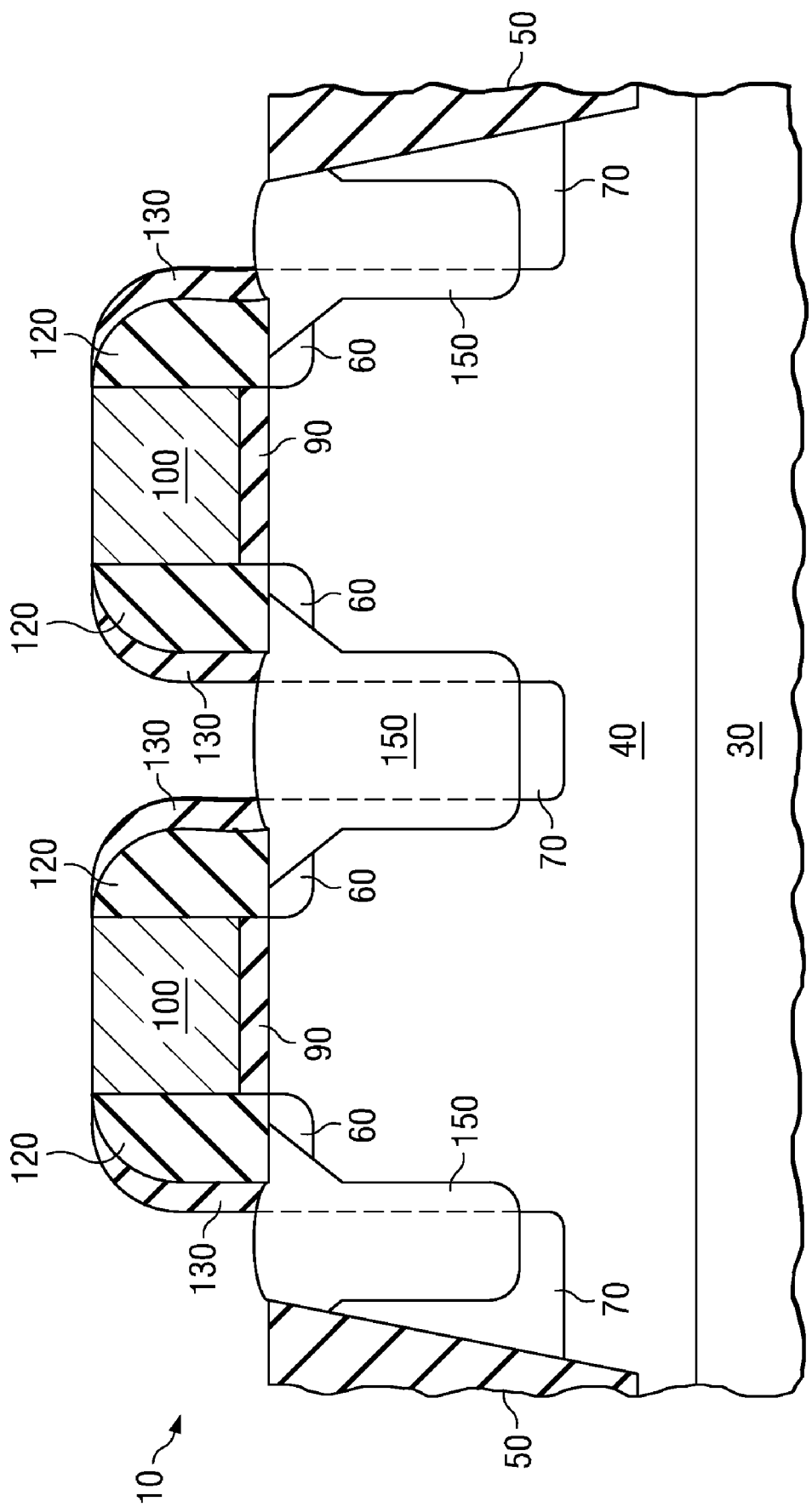

The fabrication of the semiconductor wafer 10 now continues with standard manufacturing steps. Generally, the next steps are the formation of source/drain sidewalls 130 and the creation of the source/drain regions 70. As shown in FIG. 3F, source/drain sidewalls 130 are formed proximate to the epi sidewalls 120 using any standard material and process. For example, the source/drain sidewalls 130 may be comprised of an oxide layer and a nitride layer that are formed with a CVD process and then subsequently anisotropically etched. However, the source/drain sidewalls 130 may contain more layers (. i.e. a spacer oxide layer, a silicon nitride layer, and a final oxide layer) or less layers (i.e. only an oxide layer or a nitride layer).

Next, the source/drain sidewalls 130 are used as a template for the source/drain implantation step. The source/drain regions 70 may be formed through any one of a variety of processes, such as deep ion implantation or deep diffusion. The dopants used to create the source/drain regions 70 for a PMOS transistor are typically boron; however, other dopants or combinations of dopants may be used. The implantation of the dopants is generally self-aligned with respect to the outer edges of the source/drain sidewalls 130. (However, it is to be noted that due to lateral straggling of the implanted species, the source and drain regions 70 may begin slightly inside the outer corner of the source/drain sidewalls 130. ) The source and drain regions 70 are then activated by an anneal step. This anneal step acts to repair the damage to the semiconductor wafer and to activate the dopants. The activation anneal may be performed by any technique such as rapid thermal anneal ("RTA"), flash lamp annealing ("FLA"), or laser annealing.

The fabrication of the final integrated circuit continues with standard fabrication processes to complete of the front-end structure and the back-end structure. The front-end fabrication process includes the formation of a silicide layer on the surfaces of the epitaxial SiGe regions and gate electrodes (as described more fully in the incorporated reference), the deposition of the pre-metal dielectric layer, and the creation of the metal contacts (within the dielectric layer) that are connected to the source/drain regions or the gate electrode. The back-end fabrication includes the formation of metal vias and interconnects. Once the fabrication process is complete, the integrated circuit will be tested and packaged.

Various additional modifications to the invention as described above are within the scope of the claimed invention. For example, a standard pre-clean process may be performed before the ex-situ etch (in order to remove any oxide film). Instead of using the carbon-bearing precursor $SiH_3CH_3$ (methylsilane) during the epi deposition process, other suitable carbon-bearing precursors such as $SiH_2(CH_3)_2$ (dimethylsilane) or $SiH(CH_3)_3$ (trimethylsilane) may be used. In addition, the flow of the source gases during the epi deposition process may be controlled to alter the composition of the strain or stress producing material comprising the epitaxial SiGe regions. Moreover, the source/drain dopants may be implanted before, after, or during the formation of the epitaxial SiGe regions.

Furthermore, an additional anneal process may be performed after any step in the above-described fabrication process. When used, an anneal process can improve the microstructure of materials and thereby improve the quality of the semiconductor structure. In addition, higher anneal temperatures may be used in order to accommodate transistors having thicker polysilicon gate electrodes.

Moreover, the present invention may be used during the fabrication of NMOS transistors. For example, those skilled in the art could successfully modify the methods described above to form NMOS transistors having epitaxial regions comprised of any suitable material, such as SiC.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating a PMOS transistor in a semiconductor wafer, comprising:
   providing said semiconductor wafer having a PMOS transistor gate stack, source/drain extension regions, and active regions;
   performing an ex-situ recess etch of said active regions; and
   performing an in-situ recess etch of said active regions;
   wherein said ex-situ recess etch and said in-situ recess etch form a recessed active region.

2. The method of claim 1 further comprising the step of forming epitaxial SiGe regions within said recessed active regions.

3. The method of claim 2 wherein said epitaxial SiGe regions are carbon-doped.

4. The method of claim 2 wherein said step of performing an in-situ recess etch and said step of forming epitaxial SiGe are performed sequentially in the same machine without breaking vacuum.

5. The method of claim 1 wherein said semiconductor wafer also contains extension sidewalls coupled to said PMOS transistor gate stack.

6. The method of claim 1 wherein said semiconductor wafer also contains epi sidewalls coupled to said PMOS transistor gate stack.

7. The method of claim 1 wherein said step of performing said ex-situ recess etch is before said step of performing said in-situ recess etch.

8. The method of claim 2 further comprising the step of forming source/drain regions within said semiconductor wafer.

9. The method of claim 1 wherein a depth of said recessed active regions is controlled by said ex-situ recess etch.

10. The method of claim 1 wherein a width of said recessed active regions at a surface of said semiconductor wafer is controlled by said in-situ recess etch.

11. The method of claim 2 wherein said epitaxial SiGe regions are comprised of SiGe doped with B.

* * * * *